US008450809B2

United States Patent
Yang et al.

(10) Patent No.: US 8,450,809 B2
(45) Date of Patent: May 28, 2013

(54) SEMICONDUCTOR DEVICE FOR APPLYING COMMON SOURCE LINES WITH INDIVIDUAL BIAS VOLTAGES

(75) Inventors: Seung-Jin Yang, Seoul (KR); Yong-Tae Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 159 days.

(21) Appl. No.: 12/956,920

(22) Filed: Nov. 30, 2010

(65) Prior Publication Data

US 2011/0175175 A1    Jul. 21, 2011

(30) Foreign Application Priority Data

Jan. 20, 2010    (KR) ........................ 10-2010-0005333

(51) Int. Cl.
*H01L 29/76*    (2006.01)
*H01L 29/94*    (2006.01)
*H01L 27/10*    (2006.01)
*H01L 27/108*    (2006.01)
*H01L 31/062*    (2006.01)

(52) U.S. Cl.
USPC ........... 257/391; 257/202; 257/314; 257/296; 257/369

(58) Field of Classification Search
USPC ................. 257/391, 202, 314, 313, 316, 326, 257/335, 336, 404, 499, 337, 331, 344, 345, 257/346, 296, 369, 390
See application file for complete search history.

(56) References Cited

U.S. PATENT DOCUMENTS 5,726,470 A * 3/1998 Sato .............................. 257/316
2008/0076218 A1 3/2008 Lee

FOREIGN PATENT DOCUMENTS

| KR | 1019980073090 A | 11/1998 |
| KR | 100255147 B1 | 2/2000 |
| KR | 1020080028002 A | 3/2008 |

* cited by examiner

*Primary Examiner* — Chuong A. Luu
(74) *Attorney, Agent, or Firm* — Myers Bigel Sibley & Sajovec, P.A.

(57) ABSTRACT

Provided is a semiconductor device for applying common source lines with individual bias voltages. The device includes a substrate, cell transistors arrayed in a cell matrix shape on the substrate and configured to have gate insulating patterns, gate electrodes, common source regions, drain regions and channel regions. Word lines are configured to electrically interconnect the gate electrodes with each other. Common source lines are shared between only a pair of the neighboring word lines and are configured to electrically interconnect the common source regions with each other. Drain metal contacts and source metal contacts are arranged in a straight line on the drain regions. Bit lines are electrically connected to the drain metal contacts. And impurity regions are configured to control the threshold voltage of the channel regions.

19 Claims, 15 Drawing Sheets

SEMICONDUCTOR DEVICE FOR APPLYING COMMON SOURCE LINES WITH INDIVIDUAL BIAS VOLTAGES

CROSS-REFERENCE TO RELATED APPLICATION

This application claims the benefit of Korean Patent Application No. 10-2010-0005333, filed on Jan. 20, 2010, the contents of which are hereby incorporated herein by reference in their entirety.

BACKGROUND

1. Field

Example embodiments relate to a semiconductor device for applying common source line with individual bias voltage.

2. Description of Related Art

A semiconductor device may be adapted to write, erase and read predetermined data at a memory cell. To do this, at least one common source line may be necessary to control a reference voltage.

SUMMARY

Example embodiments provide a semiconductor device in which a bias voltage is individually applied to a common source line.

Also, example embodiments provide a semiconductor device in which drain metal contacts and source metal contacts are arrayed in a straight line so that isolation layers and active regions are regularly and repeatedly arranged.

The technical objectives of the inventive subject matter are not limited to the above disclosure; other objectives may become apparent to those of ordinary skill in the art based on the following descriptions.

According to example embodiments, a semiconductor device includes: a substrate; cell transistors arrayed in a cell matrix shape on the substrate and configured to have gate insulating patterns, gate electrodes, common source regions, drain regions and channel regions; word lines configured to electrically interconnect the gate electrodes with each other; common source lines shared between only a pair of the neighboring word lines and configured to electrically interconnect the common source regions with each other; drain metal contacts and source metal contacts arranged in a straight line on the drain regions; bit lines electrically connected to the drain metal contacts; and impurity regions configured to control the threshold voltage of the channel regions. The channel regions connect the common source lines to the source metal contacts. The impurity regions are formed on a portion of the channel regions connected to one of the pair of the neighboring word lines so that the common source lines are electrically isolated from the other of the pair of the neighboring word lines.

According to other example embodiments, a semiconductor device includes: isolation layers formed as an island shape on a substrate; first active regions defined by the isolation layers and configured to extend in a y direction of the substrate; second active regions configured to serve as common source lines and configured extend in an x direction of the substrate; drain regions formed in the first active regions; common source regions formed at intersections between the first active regions and second active regions and interconnected with each other by the common source lines; channel regions formed in the first active regions and configured to connect the drain regions to common source regions; gate insulating patterns and gate electrodes sequentially stacked on the channel regions; word lines configured to apply a gate voltage to the gate electrodes; bit lines configured to apply a drain voltage to the drain regions; ground lines configured to apply a reference voltage to the common source lines; drain metal contacts configured to connect one side of the drain regions to the bit lines; source metal contacts configured to connect the other side of the drain regions to the ground lines; and impurity regions where the channel regions are doped with implantation ions and are configured to connect the source metal contacts to the common source lines to control a threshold voltage of the channel regions.

According to still other example embodiments, a semiconductor device includes: a substrate configured to have a first region where drain metal contacts are repeatedly arrayed and a second region where source metal contacts are repeatedly arrayed; drain regions formed on the substrate, where drain metal contacts and source metal contacts are arrayed in a straight line; common source regions interconnected with each other by common source lines, where no drain metal contacts and no source metal contacts are formed; channel regions configured to connect the drain regions to the common source regions; gate electrodes formed on the channel regions; bit lines connected to the drain metal contacts; and impurity regions formed in the channel regions to electrically interconnect the source metal contacts and the common source lines.

Particulars of other embodiments are included in the detailed description and drawings.

BRIEF DESCRIPTION OF THE DRAWINGS

The accompanying drawings are included to provide a further understanding of the invention, and are incorporated in and constitute a part of this specification. The drawings illustrate example embodiments of the inventive concept and, together with the description, serve to explain principles of the inventive concept. In the drawings:

FIGS. 5A through 15A are longitudinal sectional views taken along line A-A' of FIG. 1, which illustrate a method of manufacturing a semiconductor device according to example embodiments.

FIGS. 5B through 15B are longitudinal sectional views taken along line B-B' of FIG. 1, which illustrate a method of manufacturing a semiconductor device according to example embodiments.

DETAILED DESCRIPTION OF THE EMBODIMENTS

Exemplary embodiments of the inventive concept will be described below in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, it will be understood that when a layer is referred to as being "on" another layer or a substrate, it may be directly on another layer or substrate or intervening layers may be present. Example embodiments are described herein with reference to cross-sectional illustrations and/or plane illustrations that are schematic illustrations of idealized embodiments of example embodiments. In drawings, the thickness of layers and regions is exaggerated to effectively describe technical details. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1:
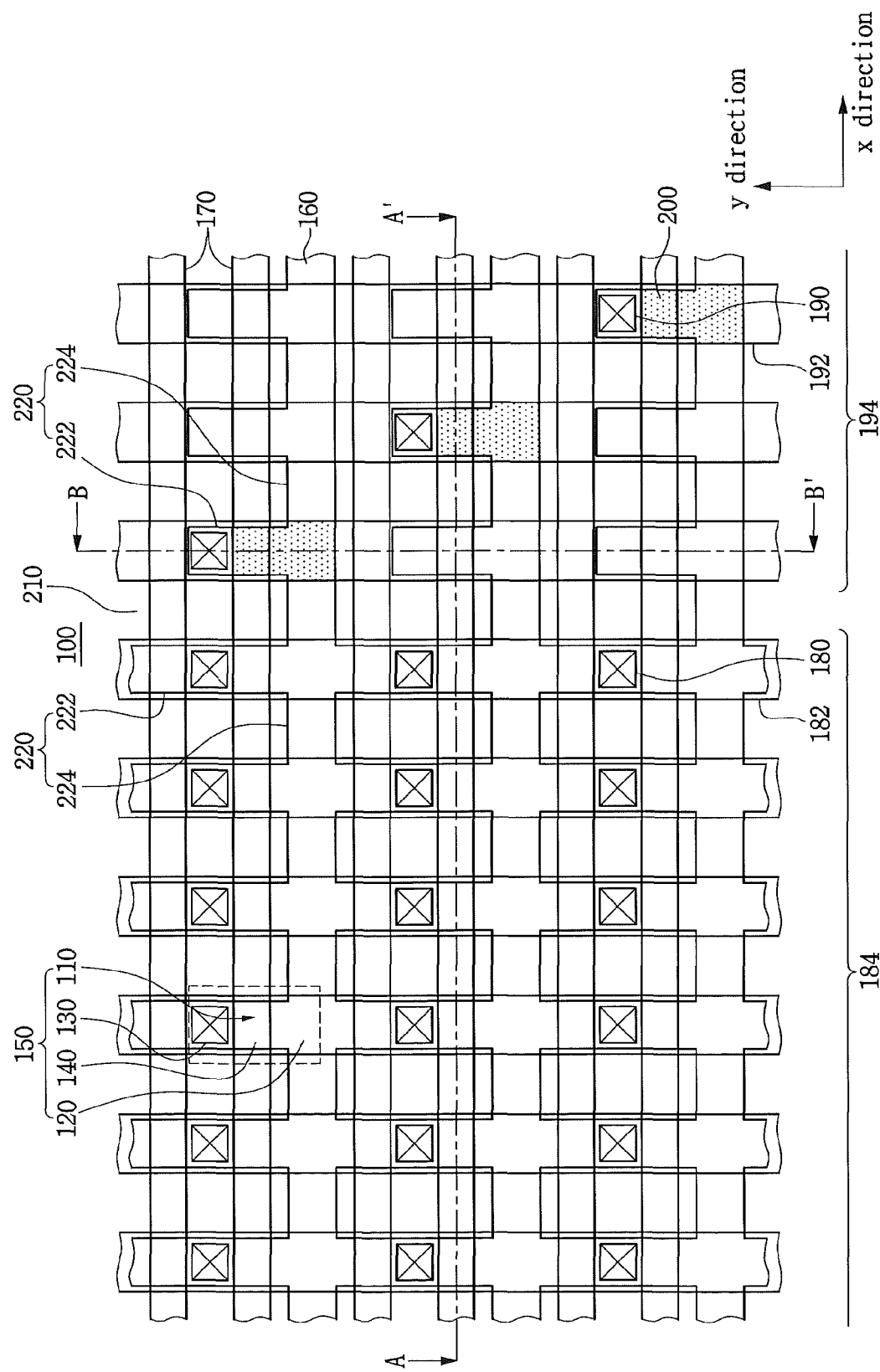
FIG. 1 illustrates a semiconductor device layer for applying a common source line with an individual bias voltage according to example embodiments.
Figure 2A:
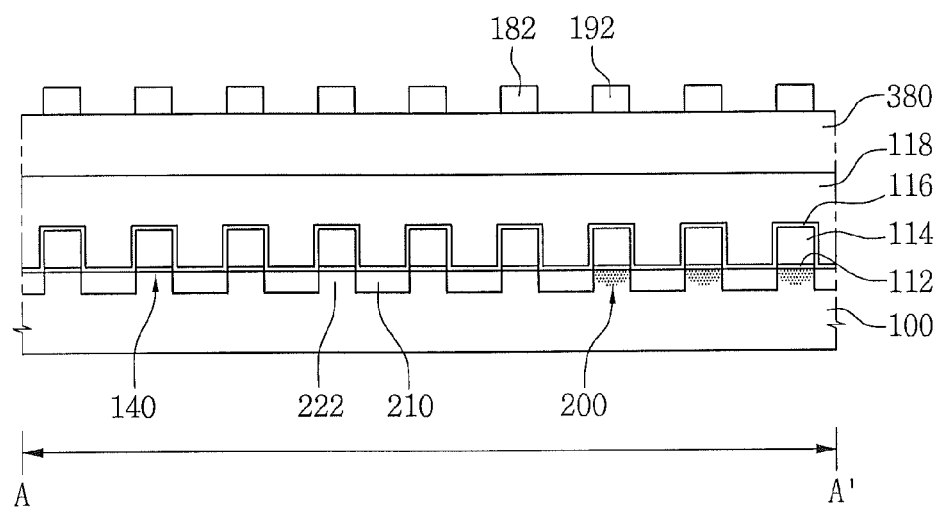
FIG. 2A is a longitudinal sectional view taken along line A-A' of FIG. 1.
Figure 2B:
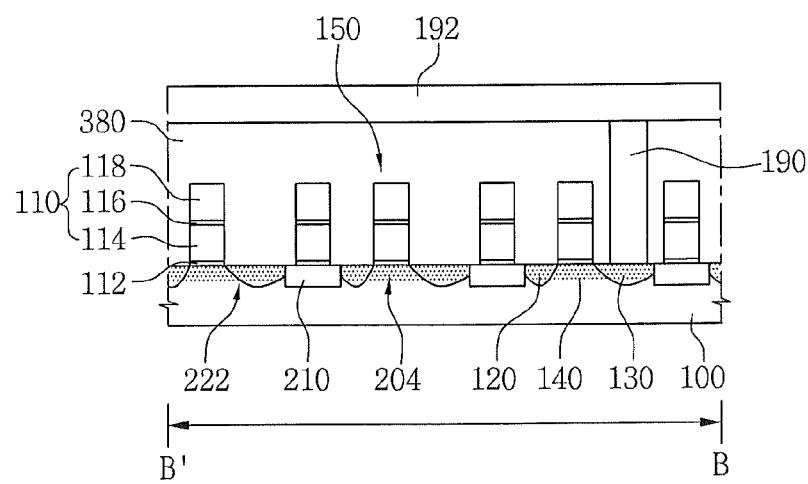
FIG. 2B is a longitudinal sectional view taken along line B-B' of FIG. 1.

FIG. 1 illustrates a semiconductor device layer for applying a common source line with an individual bias voltage according to example embodiments. FIG. 2A is a longitudinal sectional view taken along line A-A' of FIG. 1. FIG. 2B is a longitudinal sectional view taken along line B-B' of FIG. 1.

Referring to FIGS. 1, 2A and 2B, a semiconductor device according to an example embodiment of the inventive concept may include a plurality of cell transistors 150 provided with a substrate 100, a gate insulating pattern 112, a gate electrode 110, a common source region 120, a drain region 130, a channel region 140, common source lines 160 configured to electrically interconnect the common source regions 120 with each other, word lines 170 configured to electrically interconnect the gate electrodes 110 with each other, drain metal contacts 180 formed on one drain region 130, source metal contacts 190 formed on the other drain region 130, bit lines 182 electrically connected to the drain metal contacts 180, ground lines 192 electrically connected to the source metal contacts 190, and impurity regions 200 for controlling a threshold voltage configured to electrically connect the common source lines 160 to the source metal contacts 190. In this case, the channel regions 140 may be doped with a dopant to form the impurity regions 200. Thus, the impurity regions 200 may allow a cell current to flow from the drain regions 130 to the common source regions 120.

The cell transistors 150 may be arranged in a matrix shape to form cell arrays. The cell arrays of the substrate 100 may include a drain metal contact region 184 and a source metal contact region 194. The drain metal contact region 184 may be regions where the drain metal contact 180 may be repeatedly arrayed. The source metal contact region 194 may be regions where the source metal contact 190 may be repeatedly arrayed. The drain metal contact region 184 may be a memory cell array region. The source metal contact region 194 may be a dummy cell array region.

Figure 3:
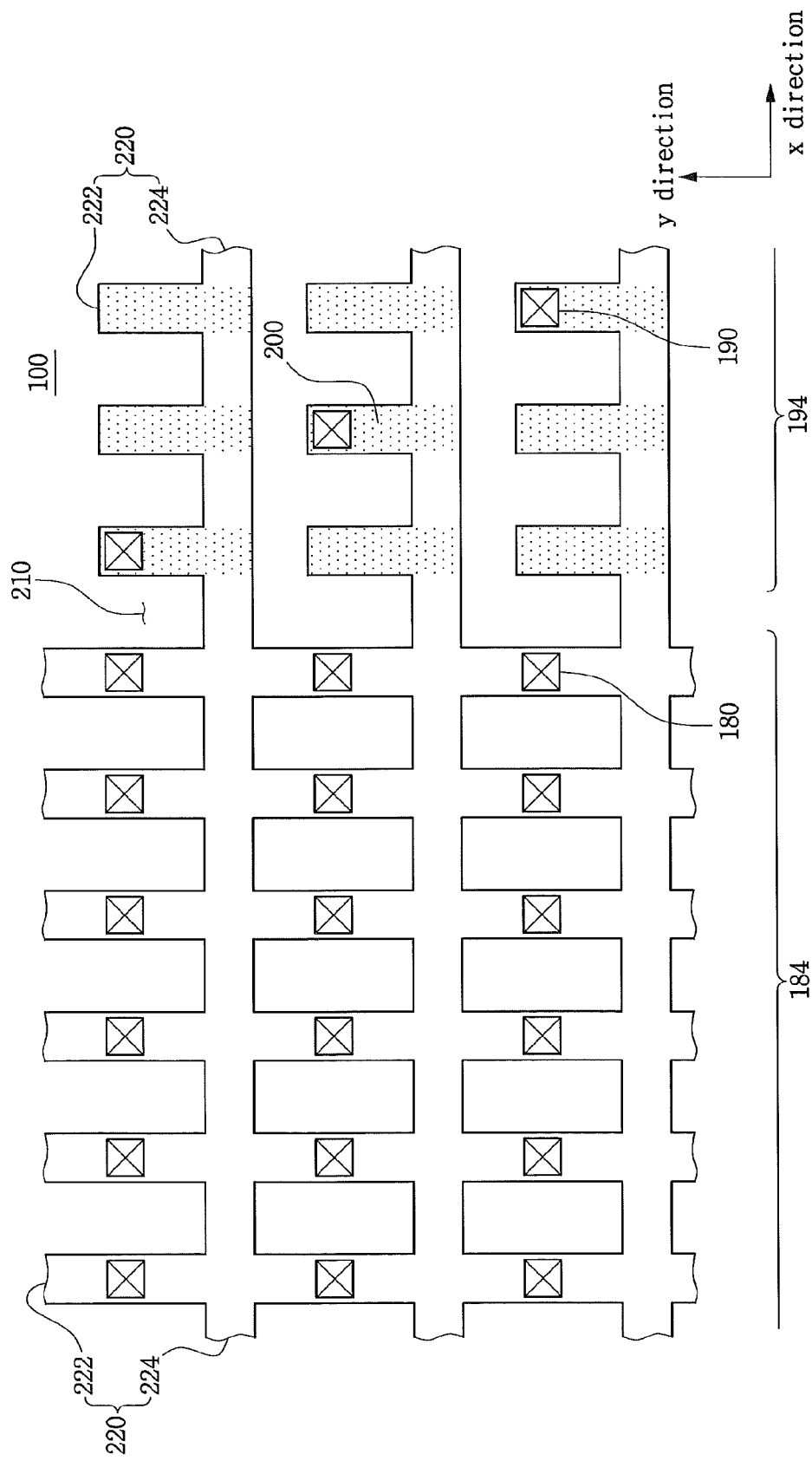
FIG. 3 illustrates the active regions and isolation layers in FIG. 1.

FIG. 3 illustrates the active regions and isolation layers in FIG. 1.

Referring to FIG. 3, the substrate 100 may include isolation layers 210 and active regions 220 defined by the isolation layers 210 in both the drain metal contact region 184 and the source metal contact region 194. The active regions 220 may include first active regions 222 extending in a y direction of the substrate 100 and second active regions 224 extending in an x direction of the substrate 100. The first active regions 222 may serve as the drain regions 130, channel regions 140 and common source regions 120. The second active regions 224 may serve as the common source lines 160 configured to interconnect the common source regions 120 with each other.

Referring to FIGS. 1, 2A and 2B, the first active regions 222 and second active regions 224 may be connected with one another in both the x and y direction in the drain metal contact region 184. The second active regions 224 may be connected to one another in the x direction, and the first active regions 222 may be isolated from one another in the y direction in the source metal contacts 194. The first active regions 222 may be discontinuously arranged by the isolation layers 210 in the y direction in the source metal contacts 194.

The isolation layers 210 may be isolated in the form of an island and the active regions 220 may be formed around the isolation layers 210 in the drain metal contact region 184. The isolation layers 210 may be connected to one another and the active regions 220 may not surround the isolation layers 210 in the source metal contact region 194.

The drain metal contacts 180 may be arrayed in a cell matrix shape and be electrically interconnected with each other in the drain metal contact region 184. On the other hand, since the first active regions 222 are discontinuously arrayed in the source metal contact region 194, the source metal contacts 190 may be isolated from each other. Accordingly, the channel regions 140 or impurity regions 200 may be discontinuously disposed in the source metal contact region 194.

Since the first active regions 222 are formed in a structure that is symmetrical with respect to the common source regions 120 and are continuously interconnected with each other in the drain metal contact region 184, the first active regions 222 may be adapted to interconnect the second active regions 224 with each other. On the other hand, since the first active regions 222 are formed in a structure that is asymmetrical with respect to the common source regions 120 and are discontinuously interconnected with each other in source metal contact region 194, the first active regions 222 may adapted to partially interconnect the second active regions 224 with each other. Accordingly, since impurity regions 200 may be partially formed in the substrate 100, the common source lines 160 may be isolated from each other and be independently controlled.

The gate electrodes 110 may have a multilayered structure in which a floating gate pattern 114 and a control gate pattern 118 are vertically stacked. The control gate pattern 118 may be formed over the floating gate pattern 114 with a gate dielectric pattern 116 interposed therebetween. The control gate pattern 118 may serve as the word line 170. Meanwhile, the gate electrodes 110 may have a single layer structure in a MOS gate of a Mask ROM.

The gate electrodes 110 may extend in the x direction of substrate 100. Since the gate electrodes 110 may run over the first active regions 222, the gate electrodes 110 may intersect the first active regions 222. Unit cells may be disposed at intersections between the gate electrodes 110 and the first active regions 222. The floating gate patterns 114 may be independently formed at the intersections. Thus, the floating gate patterns 114 may be disposed between the control gate patterns 118 and the first active regions 222.

The drain regions 130 may be disposed in the first active regions 222 on one side of the gate electrodes 110. The drain regions 130 may be discontinuously arrayed in the x direction of FIG. 1. Common source regions 120 may be disposed in the active regions 222 on the other side of the gate electrodes 110. The common source regions 120 forming source lines 160 may be continuously disposed in the x direction of FIG. 1. One gate electrode 110, one common source region 120, and one drain region 130 may constitute a single unit cell. A plurality of unit cells may be arrayed in the x and y directions to constitute a single cell array.

The drain metal contacts 180 and the source metal contacts 190 may be arrayed in the same line. In contrast, no metal contact may be disposed in the common source regions 120. The drain metal contacts 180 may be arrayed by eights, sixteens, or thirty-twos. Source metal contacts 190 may be further formed between the drain metal contacts 180 arrayed in predetermined units. The source metal contacts 190 may be arrayed by at least one. For example, the drain metal contacts 180 may be repetitively arrayed by sixteens, and the source metal contacts 190 may be repetitively arrayed by threes.

The bit lines 182 connected to drain metal contacts 180 may extend in the y direction. The ground lines 192 connected to source metal contacts 190 may extend in the y direction. The ground lines 192 may be repetitively arrayed between the bit lines 182 arrayed in predetermined units.

The drain metal contacts 180 and source metal contacts 190 may be arranged repetitively in a matrix shape on the substrate 100. When one metal contact 190 may correspond to one ground line 192, the source metal contacts 190 may be discontinuously arrayed in an x direction and a y direction.

Alternatively, ground lines 192 may be arrayed between word lines 170. The ground lines 192 connected to source metal contacts 190 may extend in an x direction of a substrate 100. For example, one ground line 192 may be repeatedly arranged between a pair of the word lines 170. In this case, the source metal contacts 190 may correspond one-to-one to the ground lines 192.

The source metal contacts 190 may never be electrically connected to the common source regions 120. But, the source metal contacts 190 have electrically constant connections to the common source regions 190 due to the impurity regions 200. The impurity regions 200 may allow the flow of current from the common source regions 120 to the source metal contacts 190 so that a cell current may flow from the common source regions 190 to the source metal contacts 190.

For example, a dopant, such as phosphorus (P) and/or arsenic (As) may be used and the threshold voltage of the channel regions 140 may be decreased so that cell transistor of the channel regions 140 may always remain turned on. The cell transistor may be a depletion transistor. Thus, the source metal contacts 190 and the common source regions 120 may be electrically interconnected with each other by the depletion transistor.

During program operation, a gate voltage may be applied to the word lines 170, a drain voltage may be applied to the bit lines 182, and a reference voltage may be applied to the ground lines 192. In this case, the gate voltage may be independently applied to the word lines 170 and the drain voltage may be independently applied to bit lines 182. Similarly, the reference voltage may be independently applied to the ground lines 192. This is because the source metal contacts 190 may be electrically connected to one common source line 160 by the impurity regions 200, while the source metal contacts 190 may be electrically disconnected from the other common source line 160 by the isolation layers 210.

When the common source lines 160 are all connected to each other in a flash memory semiconductor device, a disturb phenomenon may occur between neighboring cell transistors. For example, during program operation, when a relatively high voltage of about 8V may be applied to a selected word lines 170, 0V may be applied to the bit lines 182 and the substrate 100, respectively, and a relatively high voltage of about 5V may be applied to one common source lines 160, the disturb phenomenon may occur in an unselected cell transistor.

If source regions 120 of a plurality of cell transistors 150 may be interconnected in common by one ground line 192, the voltage drop of the ground line 192 may occur differently depending on the number of the cell transistors 150 programmed in a program operation mode. That is, the program voltage of the programmed cell transistors 150 may differ. To adjust this, if the voltage of the common source lines 160 is increased, the disturb phenomenon may occur between one cell transistor and the other cell transistor connected thereto by the common source regions 120. Such a disturb phenomenon may occur in a source side injection (SSI)-type flash memory semiconductor device in which a charge trap phenomenon may occur adjacent to the source regions 120.

But, when one common source line 160 is shared between only a pair of the neighboring word lines while not being shared between the other word lines, the common source lines 160 may be applied with an individual program operation voltage, such that the above-mentioned disturb phenomenon may be reduced or eliminated.

Figure 4:
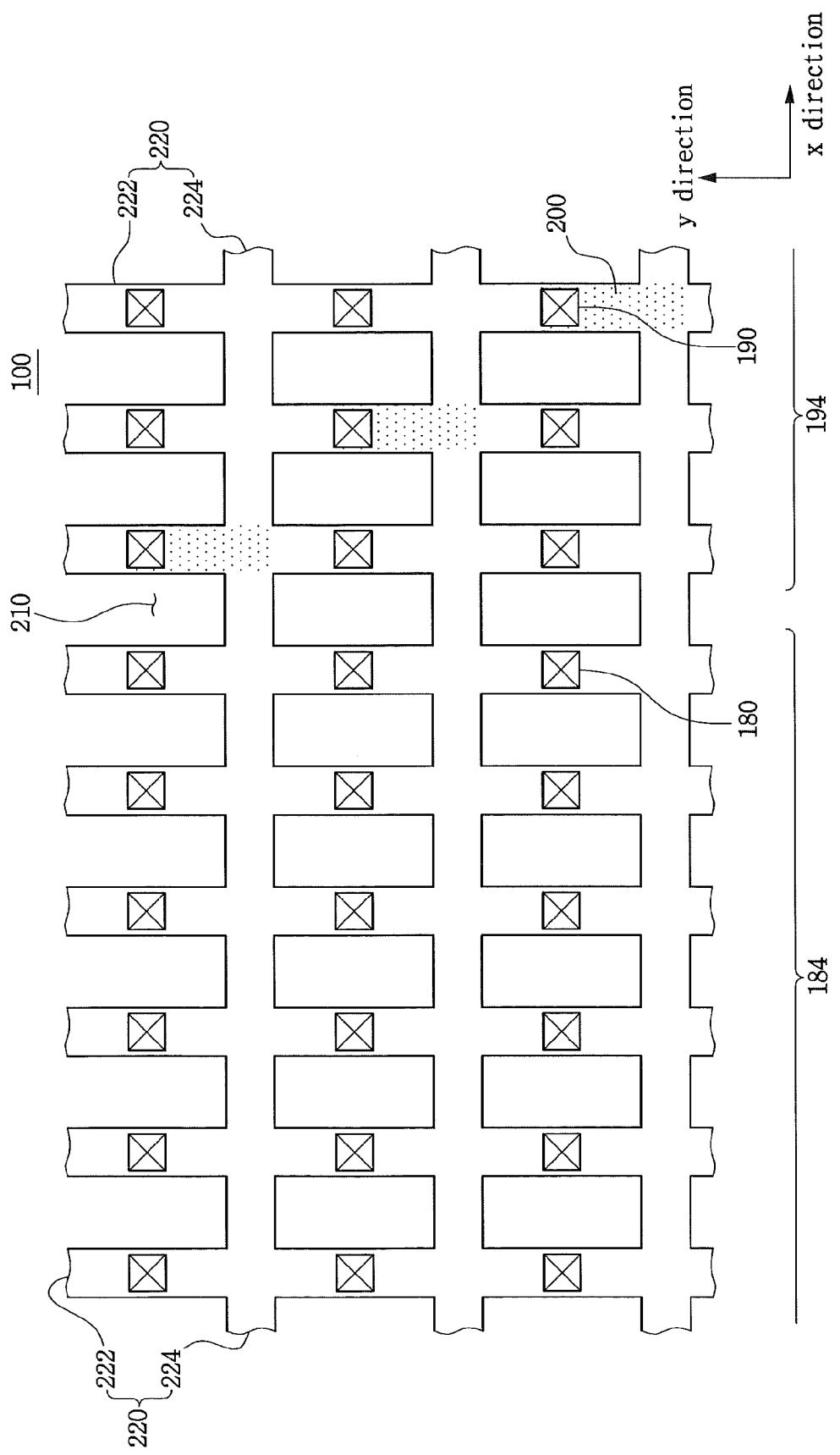
FIG. 4 illustrates active regions and isolation layers according to other example embodiments.

FIG. 4 illustrates only active regions and isolation layers according to other example embodiments.

Referring to FIGS. 1, 2A, 2B and 4, a source metal contact 190 may be electrically connected to one common source line 160 by the impurity region 200 while being electrically isolated from the other common source line 160. Thus, one common source line 160 may be shared between only a pair of the neighboring word lines 170 and may not be shared between the other word lines 170.

The drain metal contact region 184 is the same as the source metal contact region 194 in that isolation layers 210 and active regions 220 may be regularly arrayed. That is, the isolation layers 210 are isolated in the form of an island, and the active regions 220 are formed around the isolation layers in both the drain metal contact region 184 and source metal contact region 194. Thus, channel regions 140 may be formed in common on a first active region 222. However, the source metal contact region 194 is different from the drain metal contact region 184 in that impurity regions 200 may be selectively formed on the channel regions 140. Thus, the common source lines 160 may not be shared with each other.

Hereinafter, methods of manufacturing semiconductor devices according to example embodiments will be described.

FIGS. 5A through 15A are longitudinal sectional views taken along line A-A' of FIG. 1, which illustrate a method of manufacturing a semiconductor device according to example embodiments, and FIGS. 5B through 15B are longitudinal sectional views taken along line B-B' of FIG. 1, which illustrate a method of manufacturing a semiconductor device according to example embodiments.

Figure 5A:
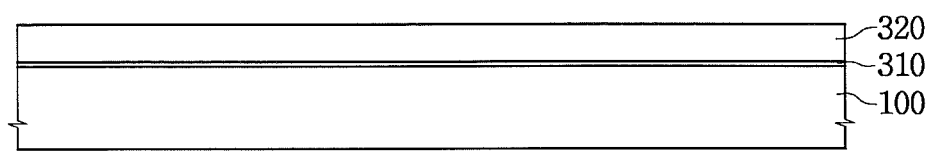
Figure 5B:
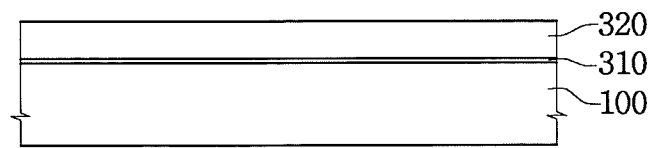

Referring to FIGS. 5A and 5B, a pad oxide layer 310 and a pad nitride layer 320 may be sequentially formed on a substrate 100 using a blank deposition process. The pad oxide layer 310 may be a thermal oxide layer. The pad nitride layer 320 may serve as a etch stop layer in a planarization process that will be described below. The pad oxide layer 310 and the pad nitride layer 320 may be formed by a chemical vapor deposition (CVD) process.

Figure 6A:
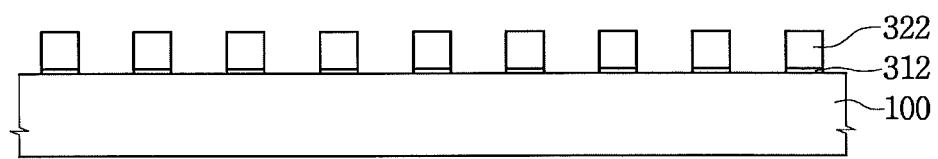
Figure 6B:
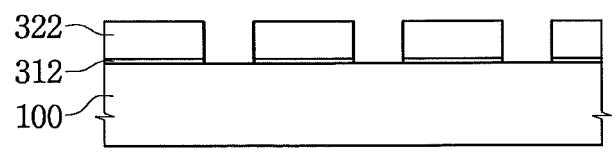

Referring to FIGS. 6A and 6B, the pad oxide layer 310 and the pad nitride layer 320 may be patterned using photolithography, thereby forming pad oxide patterns 312 and pad nitride patterns 322 extending parallel to one another in the y direction of FIG. 1.

Figure 7A:
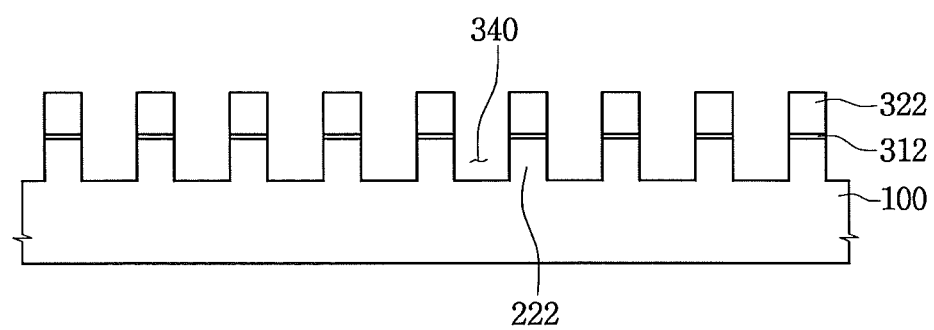
Figure 7B:
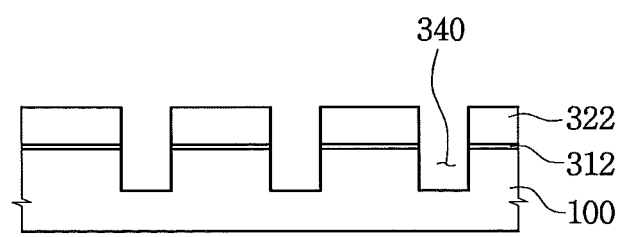

Referring to FIGS. 7A and 7B, the substrate 100 may be selectively removed using the pad oxide patterns 312 and the pad nitride patterns 322 as an etch mask, thereby forming isolation trenches 340. The isolation trenches 340 may define first active regions 222. The isolation trenches 340 may extend parallel to one another in the y direction of FIG. 1. The first active regions 222 and the isolation trenches 340 may be formed as line-and-space (L/S) type.

Figure 8A:
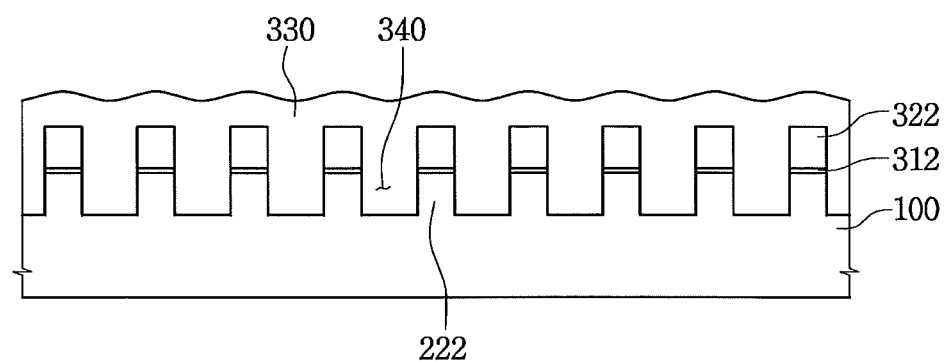
Figure 8B:
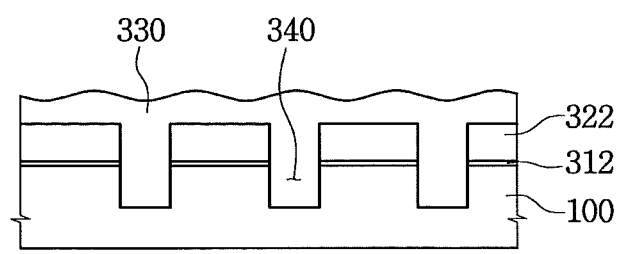

Referring to FIGS. 8A and 8B, the isolation trenches 340 may be filled with a trench insulating material 330. The trench insulating material 330 may be a high-density plasma (HDP) oxide. The trench insulating material 330 may fill the isolation trenches 340 and may be deposited even on the pad nitride patterns 322.

Figure 9A:
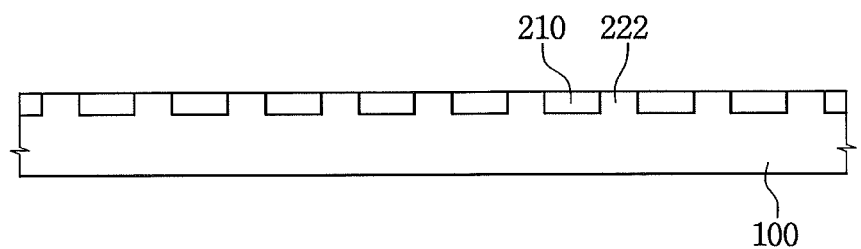
Figure 9B:
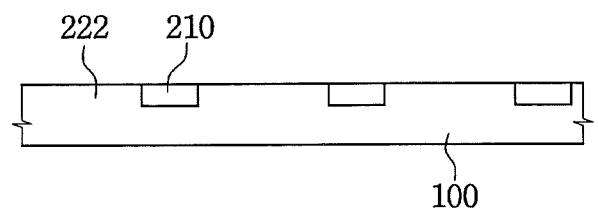

Referring to FIGS. 9A and 9B, the trench insulating material 330 may be planarized using a chemical mechanical polishing (CMP) process or an etchback process until a planar top surface of the substrate 100 is exposed. Thereafter, the pad nitride patterns 322 and the pad oxide patterns 312 may be removed. Thus, isolation layers 210 defining the first active regions 222 may be foamed.

Figure 10A:
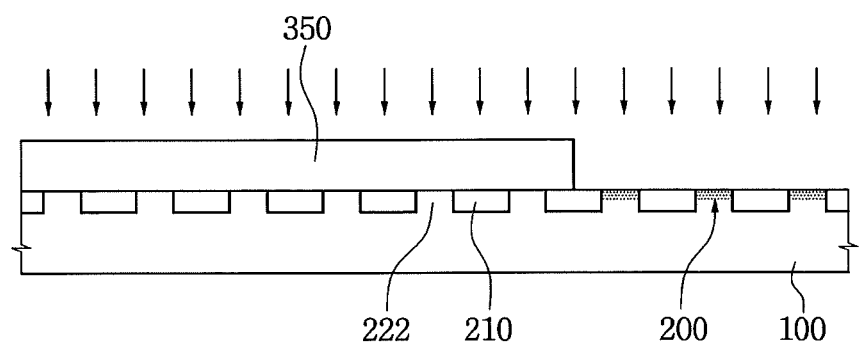
Figure 10B:
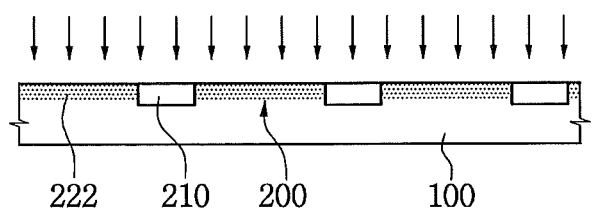

Referring to FIGS. 10A and 10B, a photoresist pattern 350 may be formed to open at least one of the first active regions 222. Impurity ions may be implanted into the substrate 100 using the photoresist pattern 350 as an ion implantation mask. The source metal contact region (refer to 194 in FIG. 3) may be selectively doped with impurity ions. Thus, impurity regions 200 for controlling threshold voltage may be formed in the first active regions 222 where the source metal contact region 194 is disposed. When the ion implantation process is finished, the photoresist pattern 350 may be removed.

During the ion implantation process, a dopant (p-type dopant) of a Group III element or a dopant (n-type dopant) of a Group V element may be used. The dopant of the Group III element may be selected from the group consisting of boron (B), gallium (Ga), and indium (In). The dopant of the Group V element may be phosphorus (P) and/or arsenic (As).

Figure 11A:
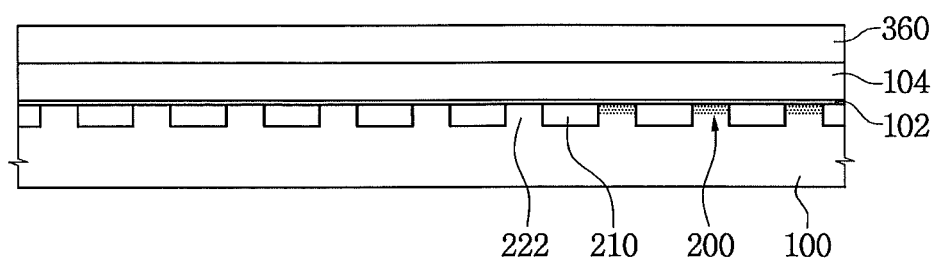
Figure 11B:
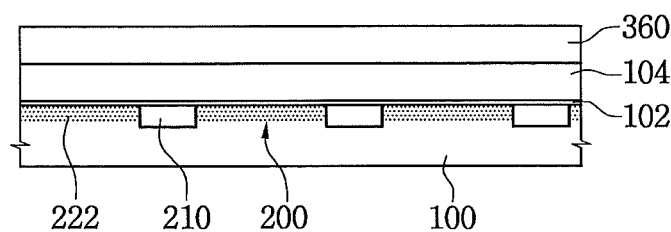

Referring to FIGS. 11A and 11B, a gate insulating layer 102 and a floating gate layer 104 may be formed on the entire surface of the substrate 100. The gate insulating layer 102 may be a thermal oxide layer. The floating gate layer 104 may be formed of doped polysilicon (poly-Si). A first hard mask layer 360 may be formed on the floating gate layer 104. The first hard mask layer 360 may be a silicon nitride layer, a silicon oxide layer, or a silicon oxynitride layer. Specifically, the first hard mask layer 360 may be a medium temperature oxide (MTO) layer. Also, the MTO layer may be formed at a temperature of about 300° C. to 600° C.

Figure 12A:
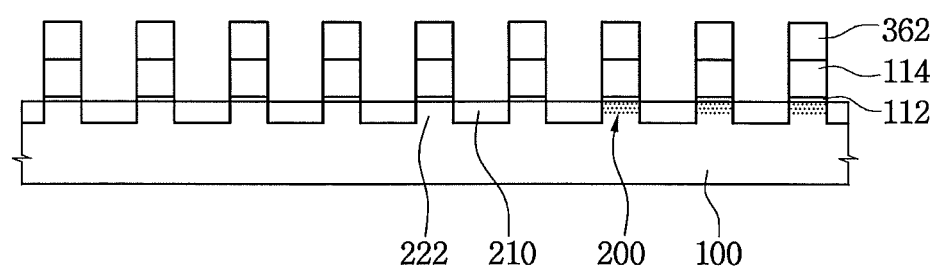
Figure 12B:
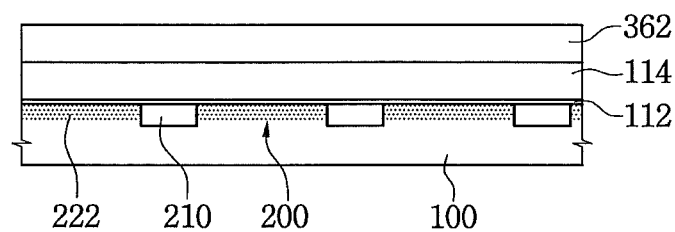

Referring to FIGS. 12A and 12B, the first hard mask layer 360 may be patterned using a photolithography process, thereby forming first hard mask patterns 362. The floating gate layer 104 and the gate insulating layer 102 may be etched using the first hard mask patterns 362 as an etch mask, thereby forming floating gate patterns 114 and gate insulating patterns 112. Thus, the isolation layers 210 may be exposed. The first mask patterns 362 may be removed.

Figure 13A:
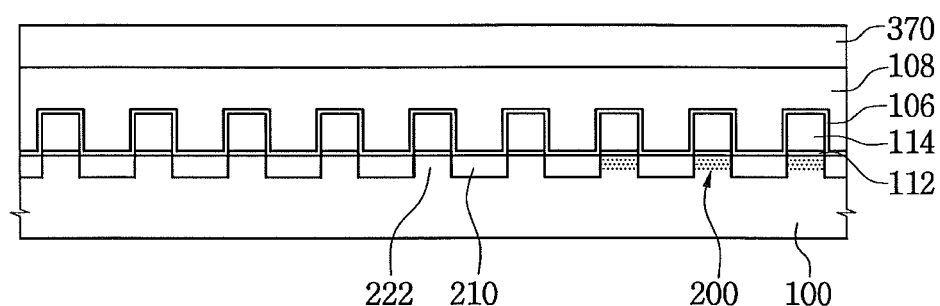
Figure 13B:
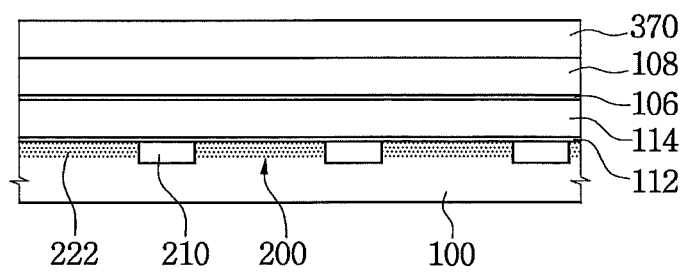

Referring to FIGS. 13A and 13B, a gate dielectric layer 106 may be formed on the floating gate patterns 114 and the isolation layers 210. The gate dielectric layer 106 may have a multilayered structure of a silicon oxide layer, a silicon nitride layer, and a silicon oxide layer. For example, the gate dielectric layer 106 may have an oxide-nitride-oxide (ONO: SiO2/Si3N3/SiO2) structure. Thereafter, a control gate layer 108 may be formed on the gate dielectric layer 106. The control gate layer 108 may be formed of doped polysilicon (poly-Si). A second hard mask 370 may be formed on the control gate layer 108.

Figure 14A:
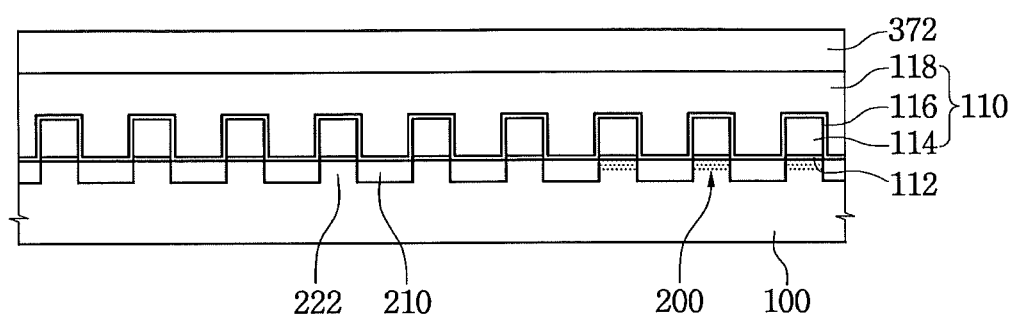
Figure 14B:
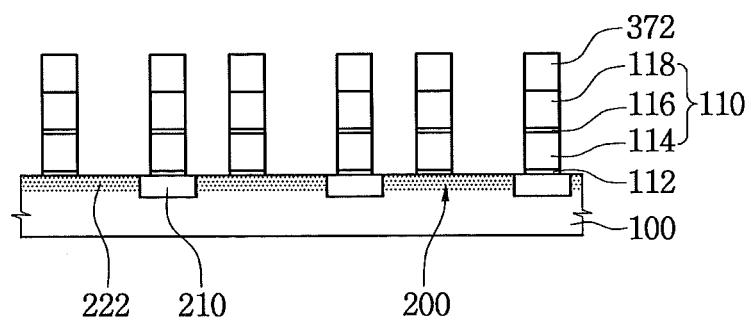

Referring to FIGS. 14A and 14B, second hard mask patterns 372 extending in the x direction of FIG. 1 may be formed using a photolithography process. The control gate layer 108, the gate dielectric layer 106, the floating gate pattern 114, and the gate insulating pattern 112 may be sequentially etched using the second hard mask patterns 372 as an etch mask to expose the first active regions 222 and the isolation layers 210 of the substrate 100. Due to the etching process, gate insulating patterns 112, floating gate patterns 114, gate dielectric patterns 116, and control gate patterns 118 may be formed. Thus, gate electrode 110 may constitute a stack gate.

Figure 15A:
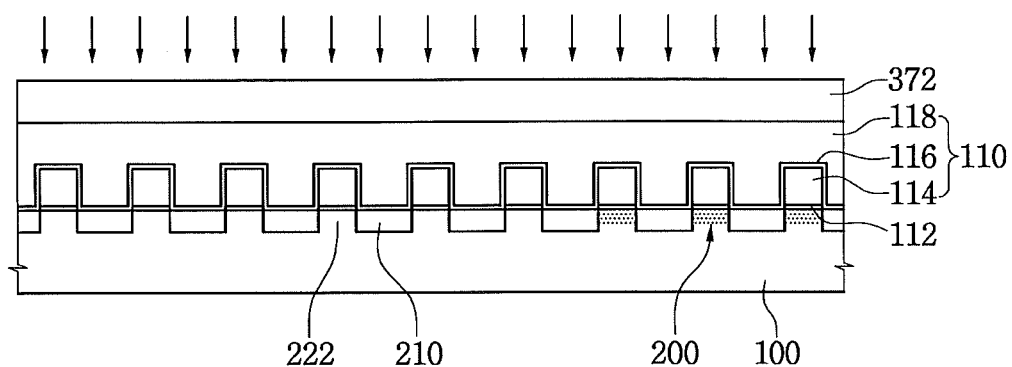
Figure 15B:
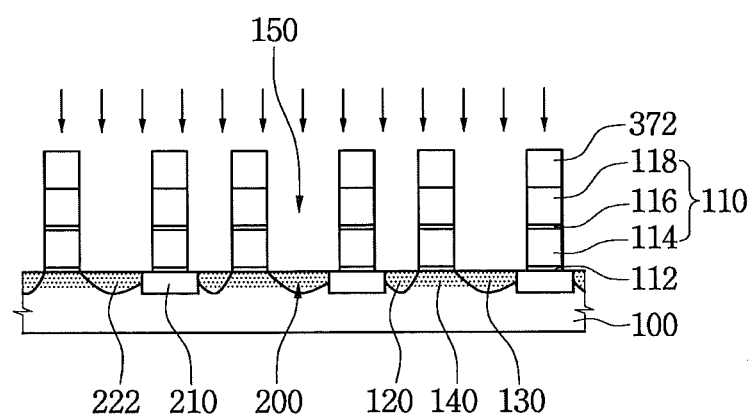

Referring to FIGS. 15A and 15B, a second ion implantation process may be performed on the exposed region of the substrate 100 having the second hard mask patterns 372. The second ion implantation process may be carried out using a dopant of a Group III element selected from the group consisting of B, Ga and IN. When impurity ions are implanted using the second hard mask patterns 372 as a second ion implantation mask, common source regions 120 may be formed in the exposed region of the substrate 100 on one side of the gate electrode 110, while drain regions 130 may be formed in the exposed region of the substrate 100 on the other side of the gate electrode 110. When the ion implantation process is finished, the second hard mask patterns 372 may be removed.

In this case, the common source regions 120 may be formed using a self-aligned source (SAS) forming process. For example, the isolation layers 210 may be removed, and impurity ions may be implanted into regions from which the isolation layers 210 are removed, thereby forming SASs. The SASs may serve as common source lines 160.

Referring back to FIGS. 2A and 2B, an interlayer insulating layer 380 may be deposited on the entire surface of the substrate 100. The interlayer insulating layer 380 may be formed of boron phosphorus silicate glass (BPSG) or phosphorus silicate glass (PSG). The interlayer insulating layer 380 corresponding to the drain regions 130 may be selectively etched, thereby forming drain contact holes (not shown) and source contact holes (not shown). The drain contact holes and the source contact holes may be filled with a conductive material, for example, tungsten (W). The conductive material may be planarized to form drain metal contacts 180 and source metal contacts 190 in the drain contact holes and the source contact holes, respectively. Thereafter, a conductive material, for example, aluminum (Al), may be deposited again on the entire surface of the substrate 100. A metal interconnection process may be performed on the conductive material, so that bit lines 182 connected to the drain metal contacts 180 can be formed in the y direction of FIG. 1 and ground lines 192 connected to the source metal contacts 190 can be formed in the y direction of FIG. 1.

In addition, the names and functions of unshown or undescribed components may be easily understood with reference to other drawings of the present specification and descriptions thereof.

According to the example embodiments as described above, a semiconductor device according to example embodiments may have at least one of the following effects:

First, source metal contacts may be electrically connected to one common source line by the impurity regions for controlling threshold voltage while being electrically isolated from the other common source line so that the one common source line may be shared between only a pair of the neighboring word lines.

Second, the one common source line may be shared between only a pair of the neighboring word lines and may not be shared between the other word lines, thereby applying the common source line with individual program operation voltage.

Third, the program operation voltage is individually applied to the common source line so that even if the number of cell transistors increase, a disturb phenomenon may be reduced or eliminated between neighboring cell transistors.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

That which is claimed:

1. A semiconductor device comprising:
   a substrate;
   cell transistors arrayed in a cell matrix shape on the substrate and comprising gate insulating patterns, gate electrodes, common source regions, drain regions and channel regions;
   word lines configured to electrically interconnect the gate electrodes with each other;
   common source lines, each common source line being shared between only a pair of the neighboring word lines and being configured to electrically interconnect the common source regions with each other;
   drain metal contacts and source metal contacts arranged in a straight line on the drain regions;
   bit lines electrically connected to the drain metal contacts; and
   impurity regions configured to control a threshold voltage of the channel regions, wherein the channel regions connect the common source lines to the source metal contacts, for respective ones of the common source lines the impurity regions being disposed on a portion of the channel regions connected to one of the pair of the neighboring word lines, so that the respective one of the common source lines is electrically isolated from the other of the pair of the neighboring word lines;
   wherein the substrate comprises a drain metal contact region where the drain metal contacts are repeatedly arrayed and a source metal contact region where the source metal contacts are repeatedly arrayed;
   wherein the substrate includes isolation layers and active regions, the isolation layers being disposed in both the drain metal contact region and the source metal contact region; and
   wherein the isolation layers are isolated in the form of an island, the active regions are formed around the isolation layers in the drain metal contact region, the isolation layers are interconnected with one another, and the active regions do not surround the isolation layers in the source metal contact region.

2. The device of claim 1, wherein the impurity regions are doped with an impurity ion comprising phosphorus (P) and/or arsenic (As).

3. The device of claim 1,
   wherein the active regions include first active regions extending in a y direction of the substrate and configured to serve as the drain regions, the channel regions and common source lines, and second active regions extending in an x direction of the substrate and configured to serve as the common source regions and the common source lines,
   wherein the first and second active regions are interconnected with one another through the common source regions in the x and y direction in the drain metal contact region and the first active regions are interconnected with one another in the x direction and the second active regions are isolated from one another by the isolation layers in the y direction in the source metal contact region.

4. The device of claim 1, wherein the gate electrodes have a single structure formed of polysilicon (poly-Si) in a MOS gate of a Mask ROM.

5. The device of claim 1, wherein the gate electrodes have a multilayered structure in which a floating gate pattern and a control gate pattern are vertically stacked with a gate dielectric pattern interposed therebetween in a source side injection (SSI)-type flash memory semiconductor device.

6. The device of claim 1, wherein the drain metal contacts and source metal contacts are arranged repetitively in an x direction and a y direction of the substrate, the drain metal contacts are continuously arrayed, and the source metal contacts are discontinuously arrayed.

7. The device of claim 1, wherein the common source lines are each respectively shared solely between a pair of the neighboring word lines, each of the common source lines being responsive to an individual program operation voltage.

8. The device of claim 7, further comprising ground lines connected to the source metal contacts,
   wherein the program operation voltage is applied to the source metal contacts through the ground lines, and the source metals contacts correspond one-to-one to the ground lines.

9. The device of claim 8, wherein the ground lines are arrayed in parallel with the word lines such that respective ones of the ground lines are disposed between respective pairs of the word lines.

10. A semiconductor device comprising:
    isolation layers formed as an island shape on a substrate;
    first active regions defined by the isolation layers and configured to extend in a y direction of the substrate;
    second active regions configured to serve as common source lines and configured to extend in an x direction of the substrate;
    drain regions formed in the first active regions;
    common source regions formed at intersections between the first active regions and second active regions and interconnected with each other by the common source lines;
    channel regions formed in the first active regions and configured to connect the drain regions to the common source regions;
    gate insulating patterns and gate electrodes sequentially stacked on the channel regions;
    word lines operable to apply a gate voltage to the gate electrodes;
    bit lines operable to apply a drain voltage to the drain regions;

ground lines operable to apply a reference voltage to the common source lines;

drain metal contacts configured to connect one side of the drain regions to the bit lines;

source metal contacts configured to connect another side of the drain regions to the ground lines; and impurity regions where the channel regions are doped with implantation ions, and are configured to connect the source metal contacts to the common source lines to control a threshold voltage of the channel regions.

11. The device of claim 10, wherein in another region where the channel regions are not doped with implantation ions, the first active regions are isolated by the isolation layers.

12. The device of claim 10, wherein the common source lines are isolated from each other, respective ones of the common source lines being responsive to individual bias voltages.

13. A semiconductor device comprising:

a substrate having a first region where drain metal contacts are repeatedly arrayed and a second region where source metal contacts are repeatedly arrayed;

drain regions formed on the substrate, where drain metal contacts and source metal contacts are arrayed in a straight line;

common source regions interconnected with each other by common source lines, where no drain metal contacts and no source metal contacts are formed;

channel regions configured to connect the drain regions to the common source regions;

gate electrodes formed on the channel regions;

bit lines connected to the drain metal contacts; and impurity regions formed in the channel regions that electrically interconnect the source metal contacts and the common source lines;

wherein the substrate includes isolation layers and active regions, the isolation layers being disposed in both the first and second regions; and wherein the isolation layers are isolated in the form of an island, the active regions are formed around the isolation layers in the first region, the isolation layers are interconnected with one another, and the active regions do not surround the isolation layers in the second region.

14. The device of claim 1, wherein the first region corresponds to a memory cell array region and the second region corresponds to a dummy cell array region.

15. The device of claim 13, wherein the source metal contacts are electrically connected to one of a pair of the adjacent common source lines by the impurity regions and electrically disconnected from the other of the pair of the adjacent common source lines by isolated layers, thereby sharing the common source lines between only a pair of the neighboring word lines, respective ones of the common source lines being responsive to individual program operation voltages.

16. The device of claim 15, further comprising:

ground lines connected to the source metal contact and configured to apply the individual program operation voltages to the common source lines through the ground lines.

17. The device of claim 13, wherein the first region includes first active regions serving as the drain regions, the channel regions and the common source regions, and second active regions serving as the common source lines, and the first active regions and the second regions are interconnected with one another in both an x direction of the substrate and a y direction, wherein the second region includes second active regions serving as the drain regions, the channel regions and the common source regions, and second active regions serving as the common source lines, the second active regions being interconnected with one another in the x direction of the substrate while only a portion of the first active regions are interconnected with one another in the y direction.

18. The device of claim 17, wherein the first active regions are symmetrically disposed relative to the common source regions and are continuously interconnected with one another, and interconnect the second active regions in all directions in the first region, wherein the first active regions are asymmetrically disposed relative to the common source regions and discontinuously interconnected with one another, and partially interconnect the second active regions to one side in the second region.

19. The device of claim 17, wherein the gate electrodes have a multilayered structure in which a control polysilicon and a floating polysilicon are vertically stacked with a gate dielectric layer interposed therebetween.

* * * * *